(12) United States Patent
Kundalgurki et al.

(10) Patent No.: US 7,084,029 B2
(45) Date of Patent: Aug. 1, 2006

(54) METHOD FOR FABRICATING A HOLE TRENCH STORAGE CAPACITOR IN A SEMICONDUCTOR SUBSTRATE, AND HOLE TRENCH STORAGE CAPACITOR

(75) Inventors: Srivatsa Kundalgurki, Dresden (DE); Dietmar Temmler, Dresden (DE); Hans-Peter Moll, Dresden (DE); Joerg Wiedemann, Dresden (DE)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 10/948,574

(22) Filed: Sep. 24, 2004

(65) Prior Publication Data
US 2005/0093049 A1    May 5, 2005

(30) Foreign Application Priority Data
Sep. 30, 2003   (DE)   ............................... 103 45 460

(51) Int. Cl.
*H01L 21/8242* (2006.01)
(52) U.S. Cl. ...................... 438/245; 438/246; 438/249
(58) Field of Classification Search ................ 438/245, 438/246, 249
See application file for complete search history.

(56) References Cited

U.S. PATENT DOCUMENTS

| 4,816,884 | A  |   | 3/1989  | Hwang et al. |
| 5,998,821 | A  |   | 12/1999 | Hieda et al. |
| 6,037,210 | A  | * | 3/2000  | Leas .......................... 438/245 |
| 6,664,167 | B1 |   | 12/2003 | Temmler et al. |
| 2003/0136994 | A1 |   | 7/2003 | Popp et al. |
| 2004/0032027 | A1 |   | 2/2004 | Popp et al. |

FOREIGN PATENT DOCUMENTS

WO    WO 03/60994 A1    7/2003

* cited by examiner

*Primary Examiner*—William M. Brewster
(74) *Attorney, Agent, or Firm*—Edell, Shapiro & Finnan, LLC

(57) ABSTRACT

To fabricate a hole trench storage capacitor having an inner electrode, which is formed in a hole trench, and an outer electrode, which is formed in an electrode section, surrounding the hole trench in a lower section, of the semiconductor substrate, the inner electrode is continued above the substrate surface of the semiconductor substrate. Then, an additional layer, which widens the semiconductor substrate, is grown onto the substrate surface by an epitaxy process. A transition surface for contact-connection of the inner electrode and at least a part of an insulation collar is formed above the original substrate surface, thereby increasing the size of a surface area of the hole trench storage capacitor, which can be used for charge storage, while using the same aspect ratio for an etch used to form the hole trench.

17 Claims, 17 Drawing Sheets

METHOD FOR FABRICATING A HOLE TRENCH STORAGE CAPACITOR IN A SEMICONDUCTOR SUBSTRATE, AND HOLE TRENCH STORAGE CAPACITOR

CROSS REFERENCE TO RELATED APPLICATIONS

This application claims priority under 35 USC §119 to German Application No. DE 103 45 460.8 filed on Sep. 30, 2003, and titled "Method for Fabricating a Hole Trench Storage Capacitor in a Semiconductor Substrate, and Hole Trench Storage Capacitor," the entire contents of which are hereby incorporated by reference.

FIELD OF THE INVENTION

The invention relates to a method for fabricating a storage capacitor for a memory cell of a semiconductor memory device in a semiconductor substrate, and to a hole trench storage capacitor.

BACKGROUND

Memory cells of dynamic random access memories (DRAMs) based on a 1T1C cell concept each comprise a storage capacitor for storing an electric charge, which characterizes a data content of the memory cell and a select transistor for addressing the storage capacitor. In trench capacitor designs, the storage capacitor is formed within a semiconductor substrate beneath a substrate surface. The select transistors are arranged oriented substantially next to one another at or on a substrate surface of the semiconductor substrate and are at least in part formed beneath the substrate surface. In each case, one select transistor is electrically conductively connected to one of the electrodes of the storage capacitor assigned to the select transistor.

A conventional method for fabricating a storage capacitor using the trench capacitor concept and a storage capacitor fabricated using the method are shown in simplified form in FIGS. 1 to 4. According to these figures, a protective layer 3, which is composed of a lower partial protective layer 32 and an upper partial protective layer 31, is applied to a substrate surface 10 of a semiconductor substrate 1, for example, made from monocrystalline, weakly p-doped silicon. The lower partial protective layer 32 is an oxide layer (pad oxide), while the upper partial protective layer 31 is a silicon nitride layer (pad nitride). The upper partial protective layer 31 protects sections of the semiconductor substrate 1, which it covers during subsequent process steps. The lower partial protective layer 32 assists with subsequent removal of the upper partial protective layer 31.

To form the storage capacitors 9, a hole mask is produced over the protective layer 3 by a lithographic method. Hole trenches 2 are introduced into the semiconductor substrate 1 through the protective layer 3 with the aid of the hole mask. A maximum aspect ratio of a minimum width to the depth of the hole trenches 2 is predetermined by the manufacturing technology used and is typically approximately 1:50. The hole mask is removed. Outer electrodes 11 are formed in an electrode section 14 of the semiconductor substrate 1 surrounding lower sections of the hole trenches 2, for example, by outdiffusion from a temporary filling of the hole trenches 2 with n-doped material. The hole trenches 2 are lined with a capacitor dielectric 5. After a first polysilicon filling has been introduced into the hole trenches 2, the polysilicon filling and the capacitor dielectric 5 are shaped back to below a top edge of the electrode section 14. A first filling section 16 of the inner electrode 6 to be formed originates from the polysilicon filling. Above a top edge of the first filling section 61, the hole trench 2 is lined with an insulation collar 4.

FIG. 1 shows two hole trenches 2 following the formation of the insulation collars 4. The protective layer 3 formed from the pad oxide 32 and the pad nitride 31 rests on the substrate surface 10 of the weakly p-doped semiconductor substrate 1. The hole trenches 2 extend through the protective layer 3 into the semiconductor substrate 1. In the electrode section 14 of the semiconductor substrate 1, the outer electrodes 11 are formed as n-doped regions, which each surround the lower section of the hole trenches 2. In each case, a first filling section 61 of the inner electrode 6 to be formed is provided inside the hole trenches 2 in the lower section. The first filling section 61 is separated from the outer electrode 11 or from the semiconductor substrate 1 by the capacitor dielectric 5. Above the first filling section 61, the hole trenches 2 are each lined by the insulation collar 4, which consists, for example, of silicon oxide produced from tetraethylorthosilane (TEOS oxide).

A second polysilicon filling is introduced into the hole trenches 2 and etched back to below the substrate surface 10. The etched-back polysilicon forms a second filling section 62 of the inner electrode 6 which is to be formed.

FIG. 2 shows the second filling section 62, which in each case adjoins the first filling section 61 in the interior of the hole trench 2. Sections of the insulation collar 4 located above the second filling section 62 are removed. A top edge of the insulation collar 4 determines a bottom edge of a transition surface 7, which is subsequently to be formed (buried strap interface).

FIG. 3 shows the insulation collars 4 once the insulation collars 4 have been shaped back. These collars are in an insulation section 16 of the semiconductor substrate 1 and insulate the second filling section 62 of the inner electrodes to be formed from the surrounding semiconductor substrate 1 and from doped regions and diffusion zones that are subsequently formed in the semiconductor substrate 1.

A third polysilicon filling is introduced into the hole trenches 2 and shaped back to below the substrate surface 10. In the process, the third polysilicon filling forms a third filling section 63 of the inner electrode 6 to be formed. Before the third polysilicon filling is introduced, a section of the semiconductor substrate 1 that is uncovered at a trench wall of the hole trench is optionally subject to a nitriding treatment in order to optimize the properties of the transition surface 7 to be formed.

FIG. 4 illustrates the third filling section 63 adjoining the second filling section 62. The height of the third filling section 63 defines a top edge of the transition surface 7. The semiconductor substrate 1 is surface-nitrided in the region of the transition surface 7 and has a nitrided layer 71. The transition surface 7 provides an electrically conductive connection between the inner electrode 6, formed from the first, second and third filling sections 61, 62, 63, of the storage capacitor 9 and a connection structure 91 formed in a connection section 15 of the semiconductor substrate 1. The connection structure 91 is, for example, a first source/drain region (S/D junction) of a select transistor assigned to the storage capacitor 9 or a doped connection region formed by outdiffusion through the transition surface 7. The insulation collar 4 and the transition surface 7 are each provided in the hole trench 2 beneath the substrate surface 10.

It is generally desired for the horizontal dimensions of memory cells having a storage capacitor to be reduced without any detrimental effect on the charge storage capacitance of the storage capacitor, or alternatively, for given horizontal dimensions to improve the charge storage options on the storage capacitor and increase the capacitance of the storage capacitor.

For example, to increase the capacitance, it is known to increase the electrode surface area by the hole trenches below a level of the select transistors being widened in a bottle shape by a wet bottle etching process or by hemispherical structures being applied to the wall of the hole trenches (hemispherical silicon grain deposition). Furthermore, it is known to increase the capacitance of the storage capacitors by selecting a material of high permittivity (high k dielectric), for example, aluminum oxide or hafnium oxide.

A method for fabricating a hole trench storage capacitor for a DRAM memory cell, which allows the hole trench storage capacitor to be formed with a higher capacitance, is desirable. A hole trench storage capacitor with a high capacitance is also desirable. Furthermore improved fabrication of the single-sided buried strap connection (SSBS) of the storage trench or hole trench storage capacitor to the associated select transistor is desirable.

SUMMARY

To fabricate a storage capacitor of a memory cell of a semiconductor memory device, such as, for example, a DRAM, in a semiconductor substrate, first a protective layer, which may be formed from a plurality of partial protective layers, is applied to a substrate surface of the semiconductor substrate. A hole mask is formed by a lithographic process, and a hole trench for each storage capacitor is introduced into the semiconductor substrate through the protective layer with the aid of the hole mask. A minimum width of the hole trench is defined as being of the order of magnitude of a minimum feature size, which is linked to the lithographic process used. A depth of the hole trench results, as a function of the width of the hole trench, from the maximum aspect ratio of minimum width to depth, which can be reliably realized in terms of manufacturing technology. The protective layer protects the semiconductor substrate which it covers from processing operations affecting the hole trenches.

In an electrode section of the semiconductor substrate, which surrounds a lower section of the hole trench, an outer electrode of the storage capacitor is formed as a doped region in the semiconductor substrate, for example, by outdiffusion from a doped semiconductor material with which the hole trench is at least temporarily filled in the lower section. At least in the lower section, the hole trench is lined with a capacitor dielectric. An inner electrode formed from a conductive material, for example, from doped polysilicon, is provided in the interior of the hole trench.

In the case of standard memory cell designs, the outer electrodes of the storage capacitors in a memory cell array are connected to one another. The inner electrodes of the storage capacitors are individually connected to a source/drain region of an associated select transistor. The source/drain region is formed as a doped region in the monocrystalline silicon of the semiconductor substrate. An electrical connection region (buried strap) between the source/drain region in the monocrystalline silicon and the inner electrode, which is typically composed of polysilicon, adjoins a transition surface (buried strap interface), in the region of which the inner electrode directly adjoins the silicon of the semiconductor substrate. For this purpose, a conductive connection structure, for example, a source/drain region of a select transistor (S/D junction) or a doped connection structure, which directly adjoins the inner electrode at the transition surface, is formed in a connection section of the semiconductor substrate, which encloses or surrounds an upper section of the hole trench.

According to the invention, to form the transition surface, the inner electrode extends beyond the substrate surface into the protective layer and in sections directly adjoins the protective layer. The protective layer is removed. Instead of the protective layer, silicon is grown on the substrate surface by a selective epitaxy process. The grown silicon forms an additional layer widening the semiconductor substrate. As a result, at least a section of the connection structure, or the connection structure and at least a section of the insulation collar, is provided within the additional layer. As a result, the transition surface is formed above the original substrate surface. Compared to known concepts, for the same aspect ratio of the etch, a region of the hole trench, which can be utilized for charge storage, is increased in size. For the same horizontal dimensions of the storage capacitor, the capacitance of the latter can be increased. Furthermore, metallization in the region of the transition surface, for example, by the production of tungsten silicide, is can be facilitated.

For example, in addition to the transition region, at least a part of an insulation collar, which is formed between the transition region and the electrode section and insulates a capacitor structure oriented at the hole trench from structures of the select transistors formed in the upper section of the semiconductor substrate, continues to above the original substrate surface. For this purpose, the insulation collar is formed in a middle section of the hole trench. The hole trench middle section is delimited by the lower section and by the upper section. The insulation collar insulates the inner electrode from an insulation section of the semiconductor substrate which surrounds the middle section of the hole trench. A top edge of the insulation collar is provided in the region of the additional layer. As a result, part of the insulation collar or the entire insulation collar is formed above the original substrate surface. A region of the hole trench, which can be used for charge storage, is further increased in size, and the capacitance of the storage capacitor is further increased for a similar aspect ratio of the etch.

To form the insulation collar, after the outer electrode has been formed, the hole trench is initially completely lined with the capacitor dielectric. A conductive material, for example, doped polysilicon, is introduced into the hole trench. Subsequently, the capacitor dielectric and the conductive material are shaped back to below the substrate surface, determining a lower edge of the insulation section, and a first filling section of the inner electrode being formed by the conductive material. The hole trench is lined with an insulator material above the lower edge of the insulation section, and the insulator material is shaped back as far as a top edge at or above the substrate surface. In the process, the insulation collar is formed by the insulator material.

In a first embodiment of the method according to the invention, the insulator material, which forms the insulation collar, is shaped back by a second conductive material being introduced into the hole trench. The second conductive material is shaped back with a second filling section of the inner electrode being formed by the second conductive material. The insulator material is either etched back with masking by the second filling section or shaped back together with the second conductive material.

According to a second embodiment of the method according to the invention, the insulator material, which forms the insulation collar, is etched back by an ion beam etching process, i.e., reactive ion etch, RIE. At least one etchback step for defining the top edge of the insulation collar or a bottom edge of the transition surface can be dispensed with. A combined statistical variability of the etchback steps influences both an electrical resistance of a transition region assigned to the transition surface and the position and extent of outdiffusion coupled to the transition surface relative to other doped regions or diffusion zones in the semiconductor substrate, in particular, to a diffusion zone assigned to a data line (bit line). The reduced number of etchback steps can reduce the statistical variability of the electrical resistance and the position of the transition region assigned to the transition surface.

To form the transition surface, the inner electrode is provided in sections directly adjacent to the protective layer. For this purpose, after the insulation collar has been formed, a third conductive material is introduced into the hole trench, forming a third filling section of the inner electrode. If the insulation collar is formed by an ion beam etching process, the third filling section in numerical terms corresponds to a second filling section.

Doped polysilicon, a metal or a conductive metal compound are, for example, suitable first, second, and third conductive materials.

The inner electrode is shaped back in the hole trench. A top edge of the inner electrode is provided above the top edge of the insulation collar, thereby defining a vertical extent of the transition surface (buried strap window).

For conventional memory cell concepts, the inner electrode in the hole trench needs to be shaped back on one side to at least beneath the top edge of the insulation collar, i.e., single-sided buried strap formation, SSBS, so that the inner electrode is connected to the associated connection structure on a connection side of the hole trench. As a result of being shaped back on one side, the inner electrode is insulated with respect to a connection structure, which is assigned to an adjacent hole trench and lies opposite the associated connection structure at the hole trench. The method according to the invention, can improve an aspect ratio of an etchback step as part of the SSBS formation compared to known methods.

A further insulator material, which forms a shallow trench isolation (STI) structure in the hole trench above the inner electrode, is introduced into the hole trench. The shallow trench isolation structure isolates the inner electrode from the connection structure which lies opposite the associated connection structure at the hole trench and is assigned to an adjacent hole trench.

To improve the stability and reliability of the electrical connection in the region of the transition surface, the inner electrode, for example, is nitrided.

When the protective layer is being applied, first a lower partial protective layer including silicon oxide (pad oxide) is provided on the substrate surface, and an upper partial protective layer including silicon nitride (pad nitride) is provided on the lower partial protective layer.

Then, during removal of the protective layer, first, the upper partial protective layer including silicon nitride is removed by a wet-chemical process or means, and, then, the lower partial protective layer including silicon oxide is removed.

The nitriding of a section of the inner electrode, which is uncovered after removal of the upper partial protective layer in the region of the transition surface, is then, for example, carried out following the removal of the upper partial protective layer and prior to the removal of the lower partial protective layer.

Prior to filling of the hole trench section above the substrate surface, the hole trench, for example, can be lined with a protective layer spacer in the region of the protective layer, thereby reducing the size of an opening of the hole trench.

If the remaining opening of the hole trench is then defined such that it corresponds to a lithography-related minimum feature size, the result is an increase in a region of the hole trench structure which is suitable for charge storage in multiple respects.

Since in particular the lower section of the hole trench is provided having a larger cross-sectional area than lithography would produce in a conventional concept, the electrode surface area is increased in accordance with the larger circumference. Compared to a known wet bottle etching process for increasing the cross section of the hole trench in a lower region of the hole trench, the opening of the hole trench has a larger cross section during etching of the hole trenches. For the same predetermined aspect ratio and the same diameter of the inner electrode in the region of the newly formed substrate surface, the hole trench can as a result be realized with a greater depth compared to with a wet bottle etching process, with the result that the region of the hole trench which is suitable for charge storage is additionally increased in size.

Prior to the protective layer spacer, the first filling section of the inner electrode can be formed substantially up to just below the substrate surface and oxidized at the uncovered surface. An auxiliary insulator layer is formed by the oxidized region of the first filling section. The auxiliary insulator layer is opened up during or after the formation of the insulation collar, and the first filling section of the inner electrode is uncovered. The auxiliary insulator layer produces an auxiliary insulator structure which insulates the inner electrode from the silicon, which grows during the further process at the location of the previously removed protective layer spacer. The auxiliary insulator structure adjoins both the capacitor dielectric and the insulation collar.

In another embodiment of the method according to the invention, a layer thickness of the protective layer is recorded before the protective layer is removed, and the epitaxy process for growth of silicon on the semiconductor substrate is controlled based on the result of the layer thickness measurement. As a result, it is possible, by the layer thickness of the grown silicon, to set a remaining step height of the shallow trench isolation structure such that a subsequent chemical mechanical polishing process (CMP process) acting on the shallow trench isolation structure is optimized by compensating for the topology or the relief, which is to be machined over the semiconductor substrate. Furthermore, an aspect ratio of the shallow trench isolation structure is reduced compared to conventional processes, and this alone improves the overall uniformity of the CMP process acting on the shallow trench isolation structure.

The storage capacitor according to the invention, which results from the method according to the invention, is provided for a memory cell in a semiconductor memory device, for example, a DRAM.

An inner electrode of the storage capacitor according to the invention is arranged in a hole trench, which extends from a substrate surface into a semiconductor substrate. An outer electrode of the storage capacitor is formed as a doped region in an electrode section of the semiconductor substrate, which surrounds the hole trench in a lower section.

A capacitor dielectric is provided between the outer electrode and the inner electrode. A transition surface is formed between the inner electrode and a conductive connection structure formed in a connection section of the semiconductor substrate, which surrounds the hole trench in an upper section. This transition surface provides an electrically conductive connection between the inner electrode and the connection structure.

According to the invention, the connection section of the semiconductor substrate is formed in an additional layer, formed from an epitaxy process, of the semiconductor substrate.

For example, an insulation collar, which surrounds the inner electrode in an insulation section provided between the electrode section and the connection section of the hole trench, is provided such that its upper edge is located within the additional layer.

The hole trench can, for example, be formed such that the hole trench has a smaller cross-sectional area in the region of the additional layer than in an original substrate section of the semiconductor substrate arranged beneath the additional layer. In order for the storage capacitor to be embedded in a memory cell array concept, which has a maximum structure density in accordance with a lithographic process, the cross-sectional area of the hole trench in the region of the additional layer is provided so as to correspond to a lithography-related minimum feature size.

Insulation of the inner electrode with respect to the semiconductor substrate is, for example, supplemented in a shoulder region of the hole trench, in which the cross section of the latter widens, by an annular auxiliary insulator structure arranged beneath the insulation collar.

Compared to known hole trench storage capacitors, the storage capacitor according to the invention can increase capacitance for the same horizontal dimensions, as described above.

BRIEF DESCRIPTION OF THE FIGURES

The invention is explained in more detail below with reference to the figures, in which corresponding components are denoted by identical reference symbols. In each case using simplified cross sections.

DETAILED DESCRIPTION

Figure 1:
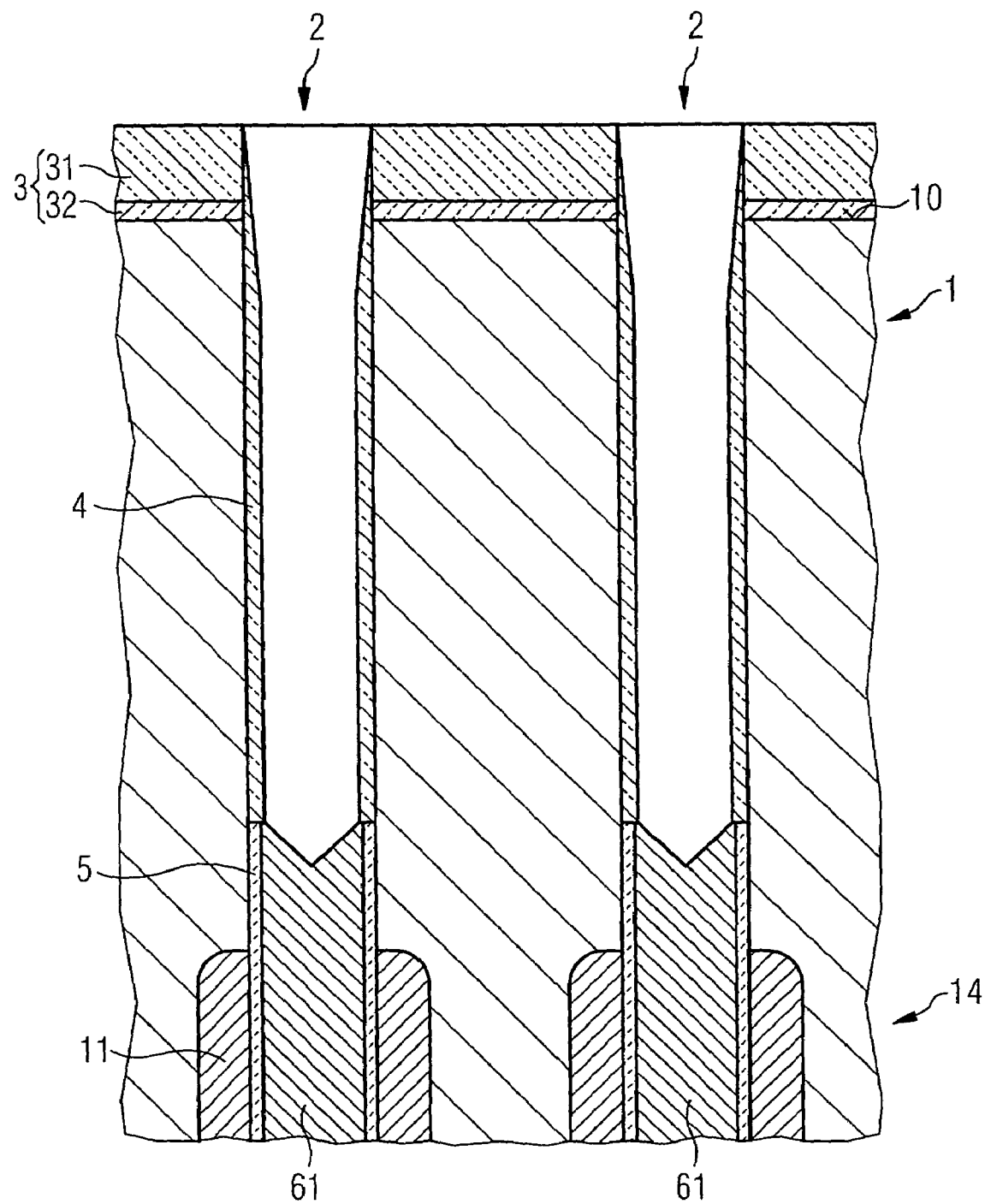
FIG. 1 to FIG. 4 show a conventional method for fabricating hole trench storage capacitors in four process stages.
Figure 2:
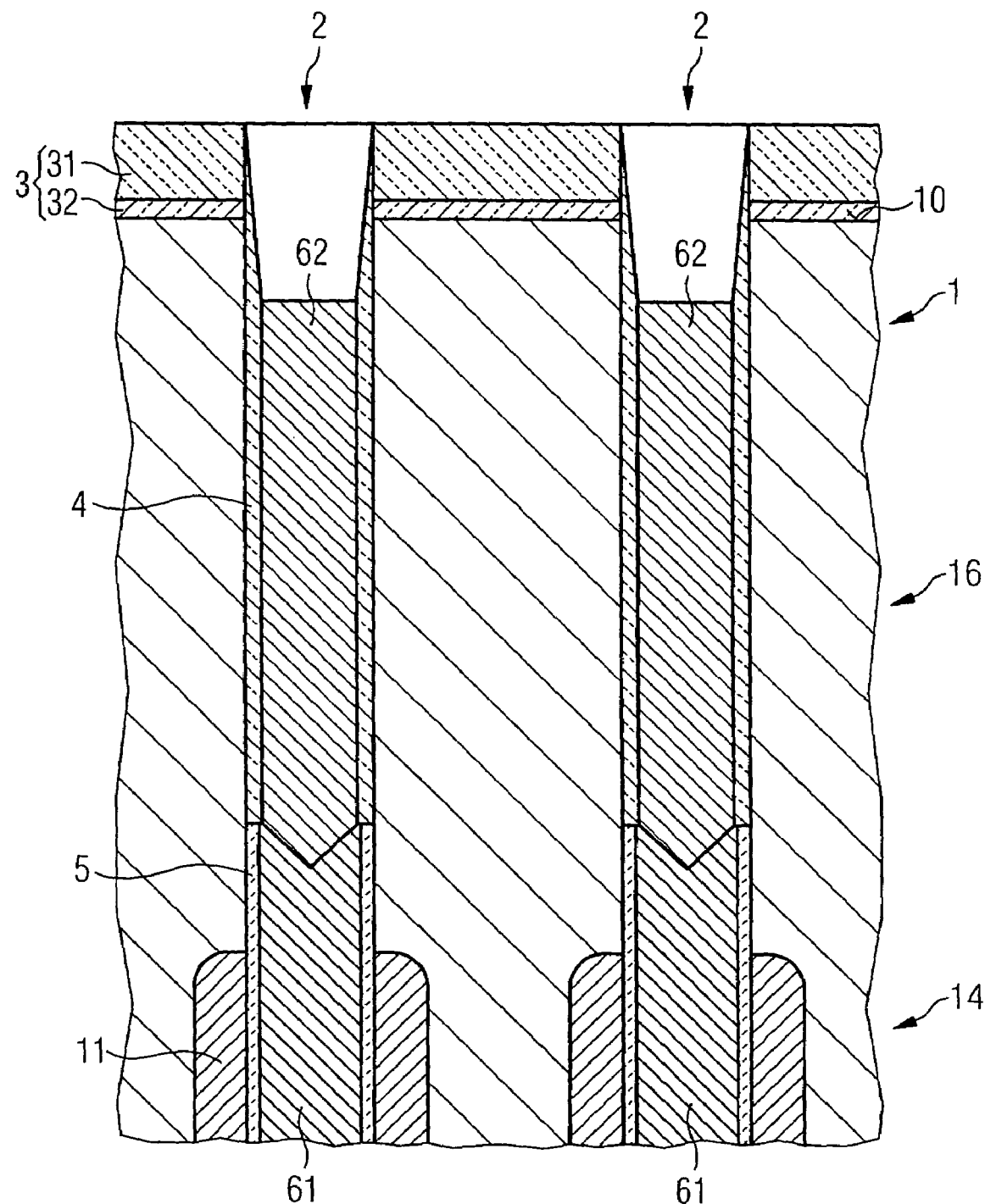
Figure 3:
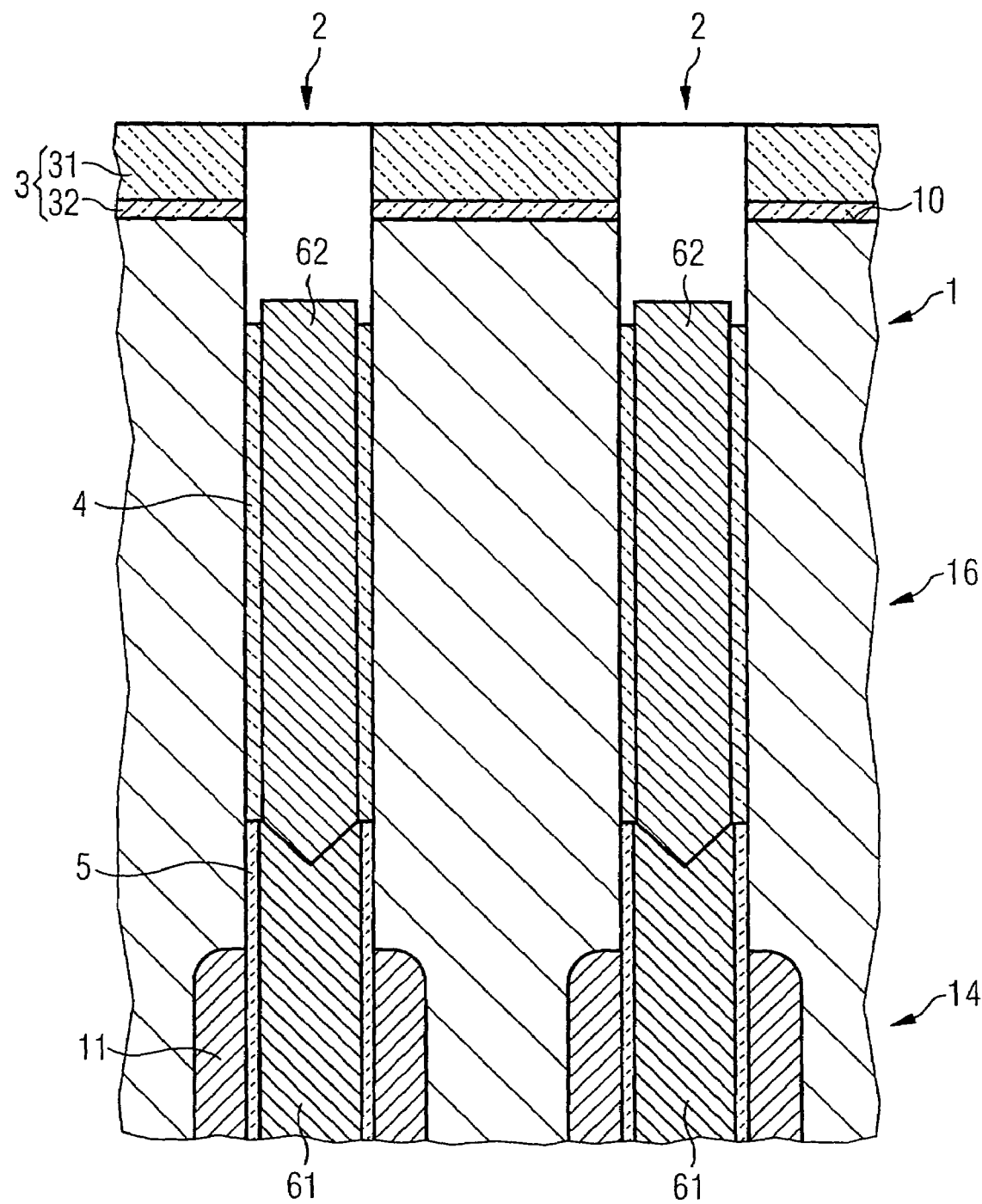
Figure 4:
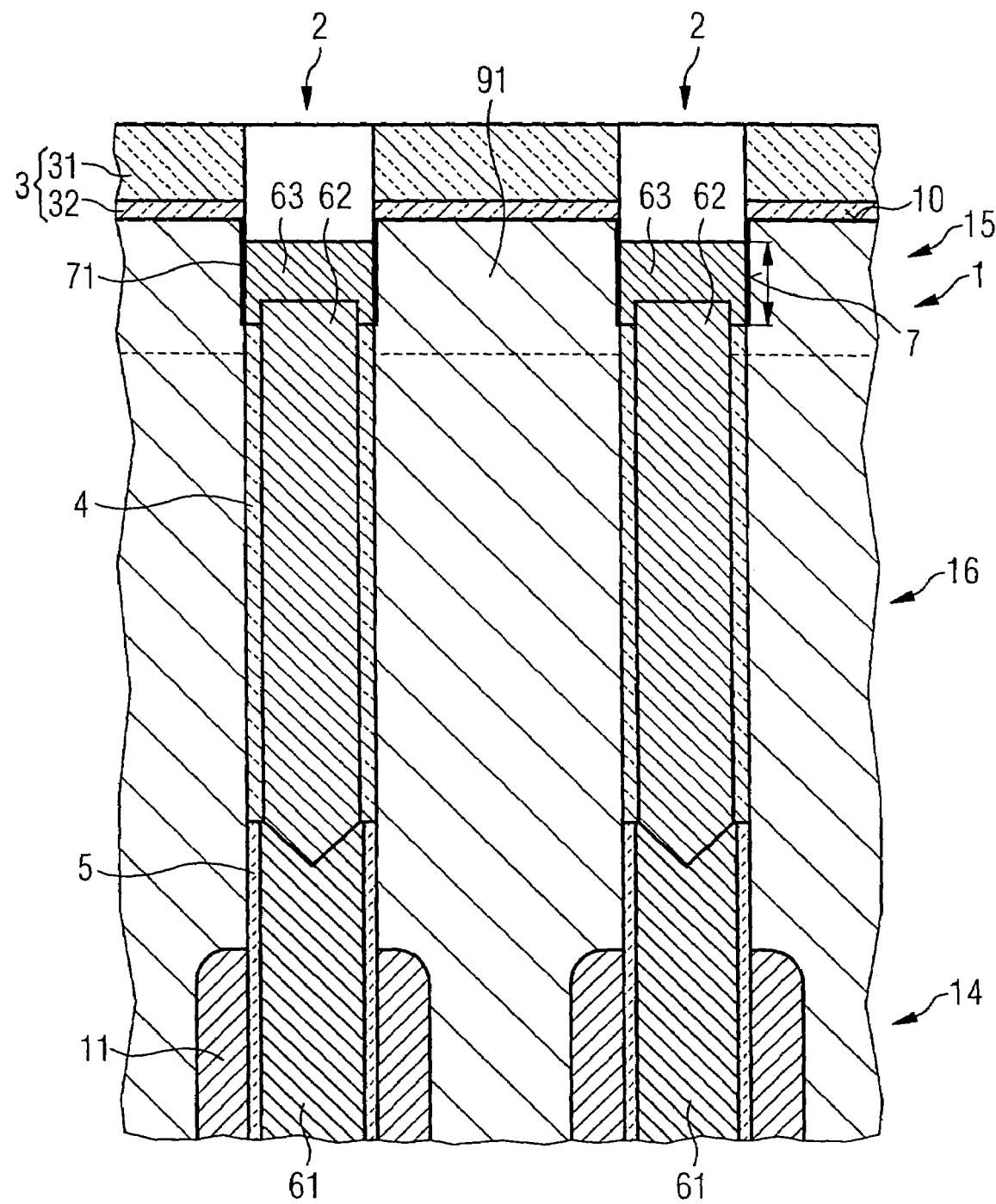

In a first exemplary embodiment of the method according to the invention, which is explained with reference to FIGS. 5–13, a protective layer 3 is applied to a substrate surface 10 of a semiconductor substrate 1 formed from monocrystalline, weakly p-doped silicon. The protective layer 3 includes a lower partial protective layer 32 and an upper partial protective layer 31. The lower partial protective layer 32 is an oxide layer (pad oxide), and the upper partial protective layer 31 is a silicon nitride layer (pad nitride).

Using a hole mask, hole trenches 2 are introduced into the semiconductor substrate 1 through the protective layer 3. An aspect ratio of width to depth of the hole trenches 2 is, for example, approximately 1:50. Outer electrodes 11 are formed in an electrode section 14 of the semiconductor substrate 1, which surrounds lower sections of the hole trenches 2 by outdiffusion from a temporary filling of the hole trenches 2 with n-doped material. The hole trenches 2 are lined with a capacitor dielectric 5. After a first polysilicon filling has been introduced into the hole trenches 2, the polysilicon filling and the capacitor dielectric 5 are shaped back down to a top edge of the electrode section 14, with a first filling section 61 of the inner electrode 6 to be formed being produced from the polysilicon filling.

Figure 5:
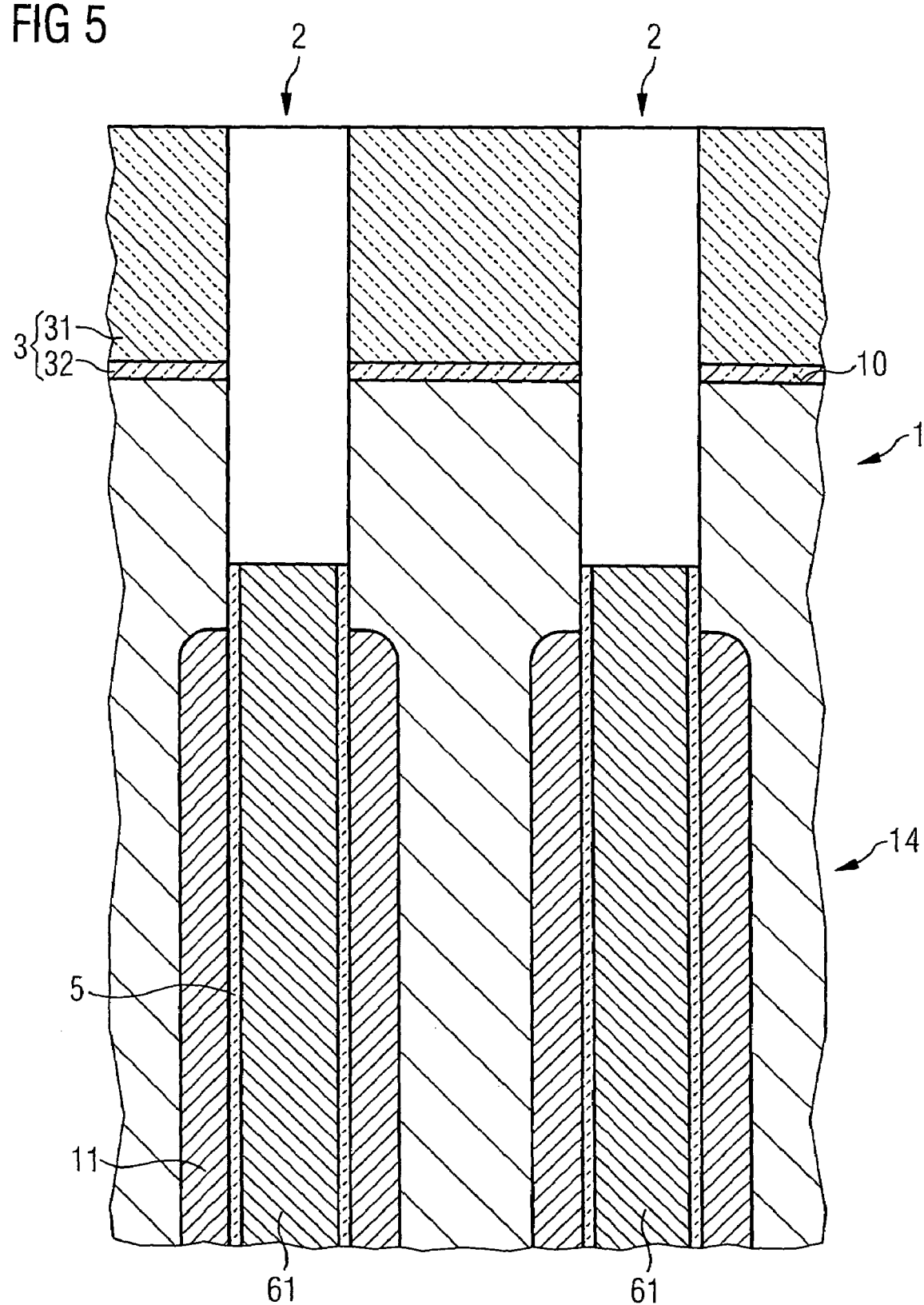
FIG. 5 to FIG. 13 show the fabrication of hole trench storage capacitors according to the invention according to a first exemplary embodiment of the method according to the invention, in nine process stages.

FIG. 5 shows the first filling section 61 in the interior of the hole trenches 2. The silicon nitride layer 31 is provided with a layer thickness, which is relatively greater than in the known method. A top edge of the first filling section 61 is relatively closer to the substrate surface 10 than in FIG. 1. Above the top edge of the first filling section 61, the hole trenches 2 are lined with an insulation collar 4.

Figure 6:
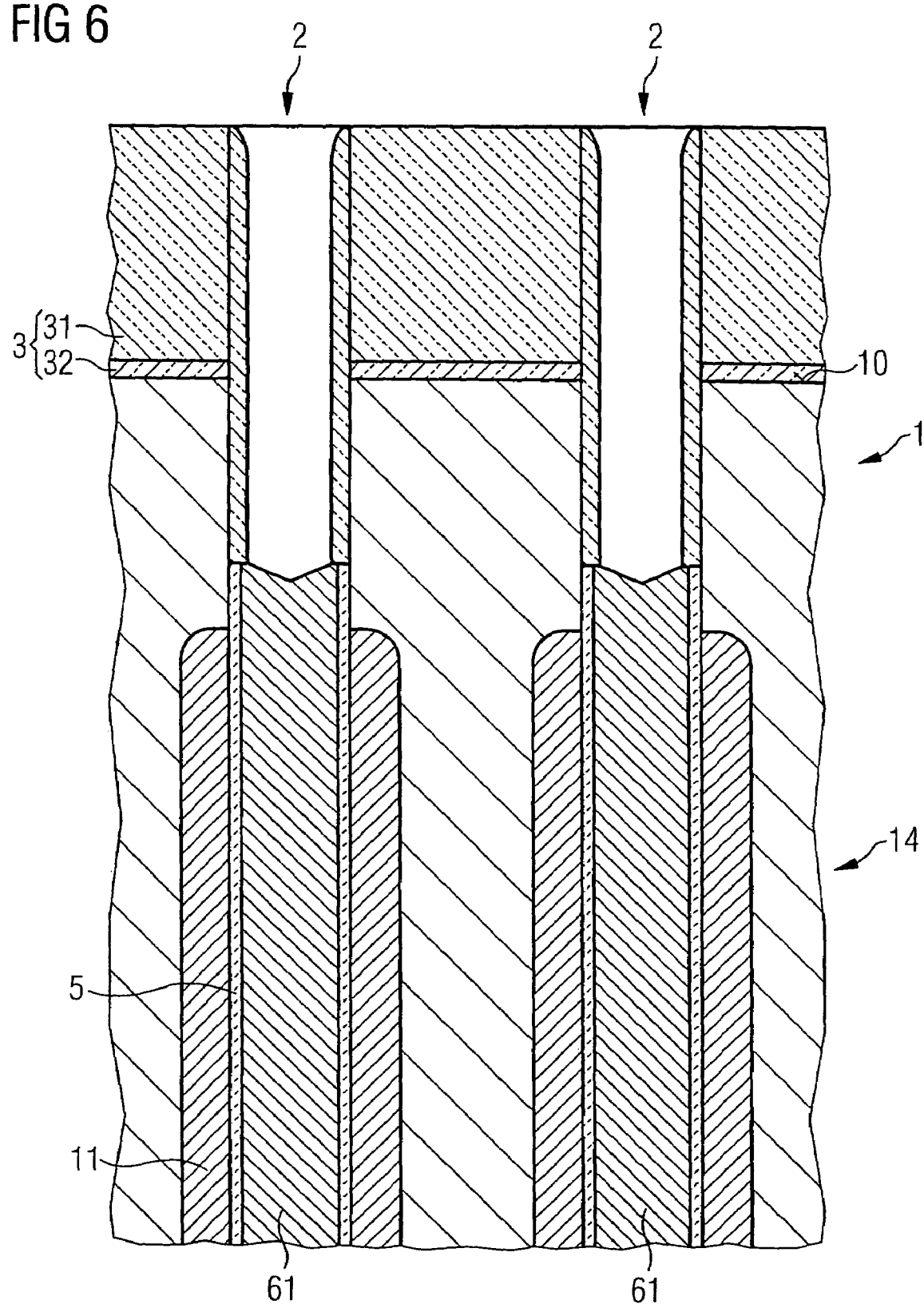

In FIG. 6, the insulation collars 4 each initially extend through the protective layer 3 as far as the top edge of the first filling section 61. The insulation collars 4 are formed, for example, from silicon oxide originating from a TEOS process.

A second polysilicon filling is introduced into the hole trench 2. Second filling section 62 of the inner electrode 6 to be formed, has an upper edge, which is provided in the region of the protective layer 3 above the substrate surface 10. The second filling section 62 of the inner electrode 6 is formed by etchback from the second polysilicon filling. The insulation collar 4 is shaped back in the region of the protective layer 3.

Figure 7:
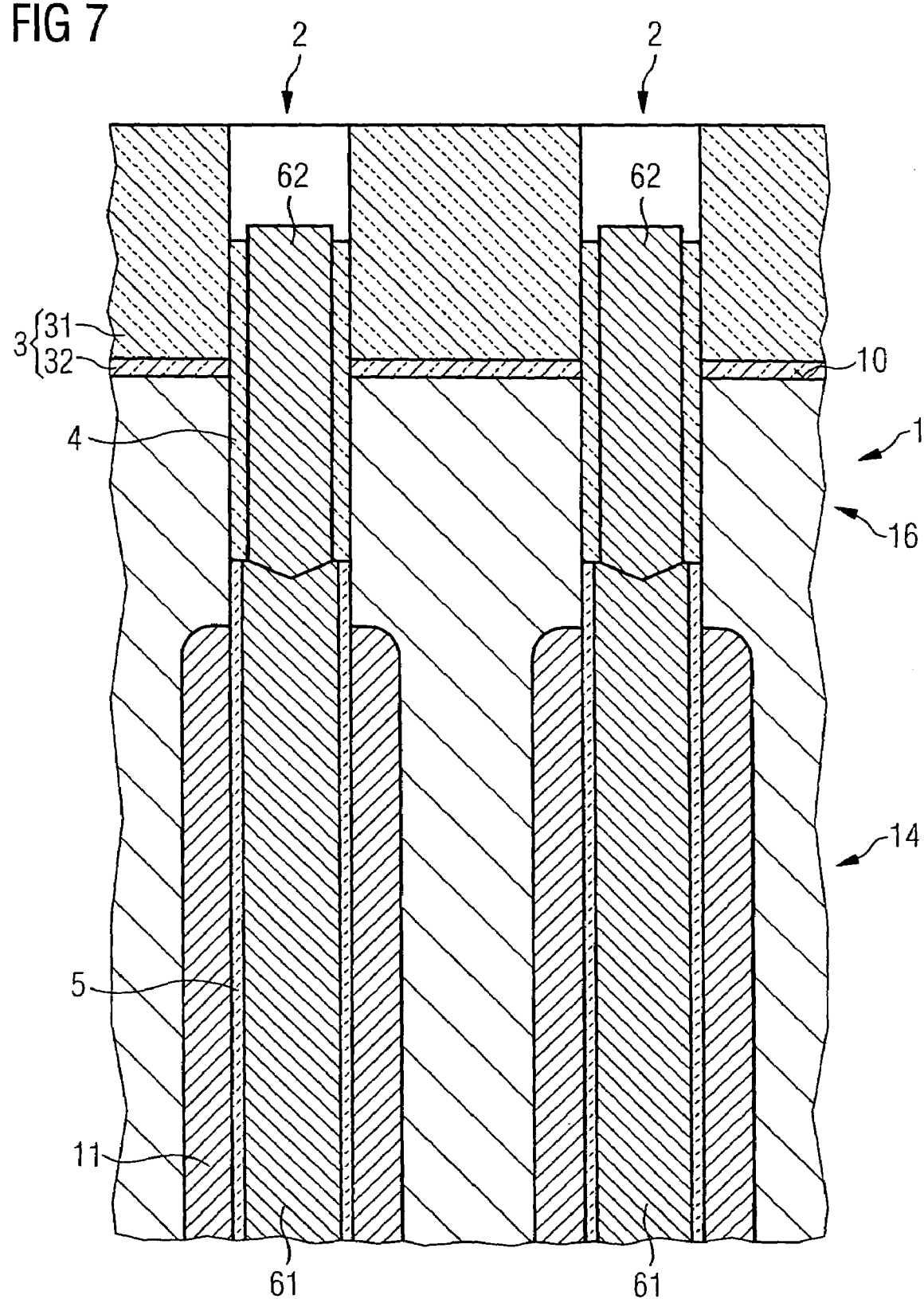

FIG. 7 shows the second filling section 62, adjoining the first filling section 61. In this exemplary embodiment, the insulation collar 4, like the second filling section 62, continues out of the semiconductor substrate 1, above the substrate surface 10. The top edges of the insulation collar 4 and of the second filling section 62 in this exemplary embodiment are located in the region of the protective layer 3. In a further exemplary embodiment (not shown), the top edge of the insulator collar is formed, for example, approximately at the substrate surface 10 or relatively slightly above it, so that the transition surface 7 is formed just above the substrate surface 10.

Following the second filling section 62, a third polysilicon filling is introduced into the hole trench 2 and etched back to below a top edge of the protective layer 3. The depth of etchback determines a vertical extent of a transition surface 7, which is subsequently to be formed.

Figure 8:
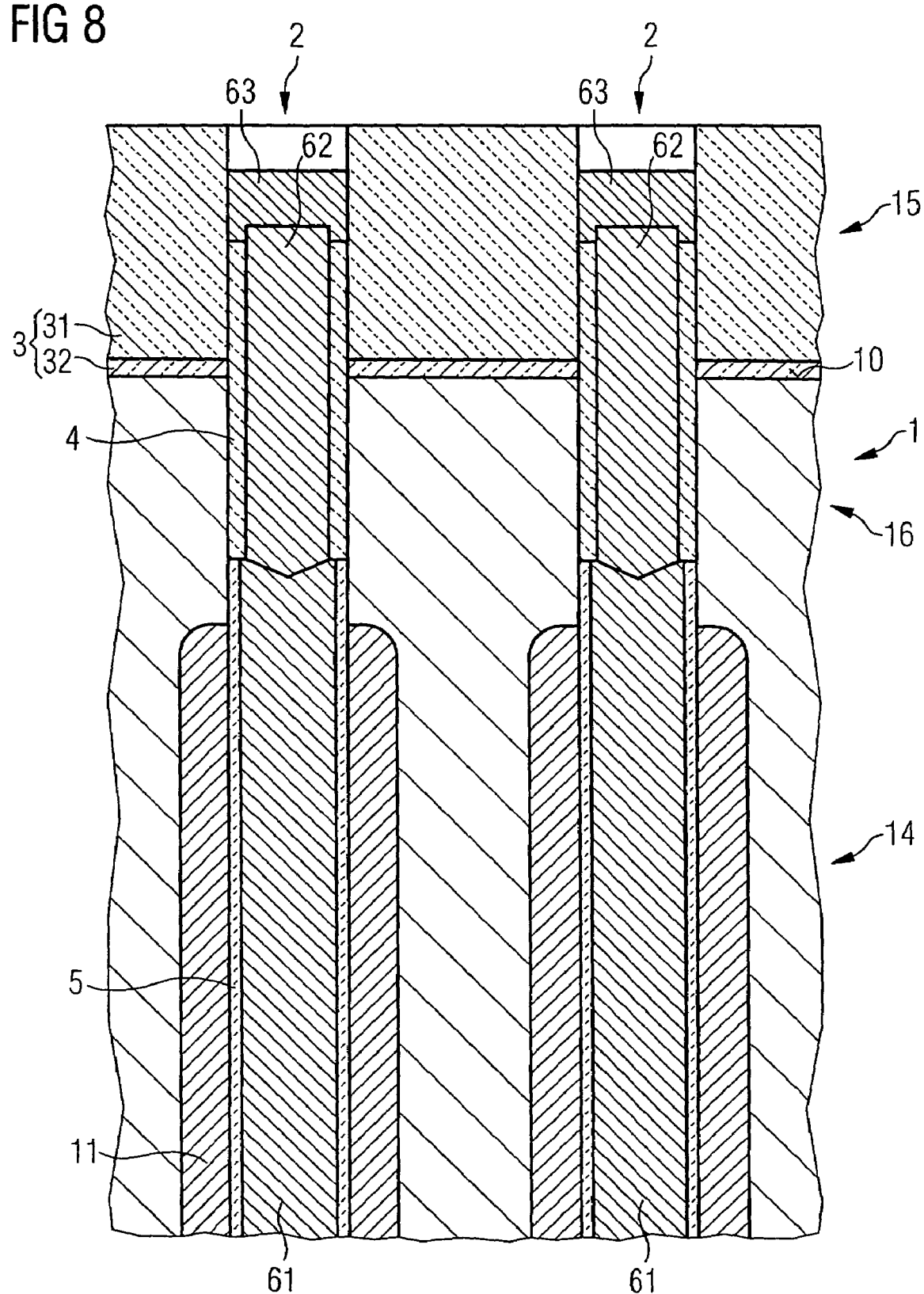

FIG. 8 shows the third filling section 63, which has been shaped back to below the top edge of the protective layer 3, adjoins the second filling section 62 and, above the insulation collar 4, is adjacent to the silicon nitride layer 31.

Subsequently, an inner electrode 6, is shaped back from the top, on one side, down to below the top edge of the insulation collar 4 (known as single-sided buried strap formation, SSBS. The inner electrode 6 has three filling sections 61, 62, 63.

Figure 9:
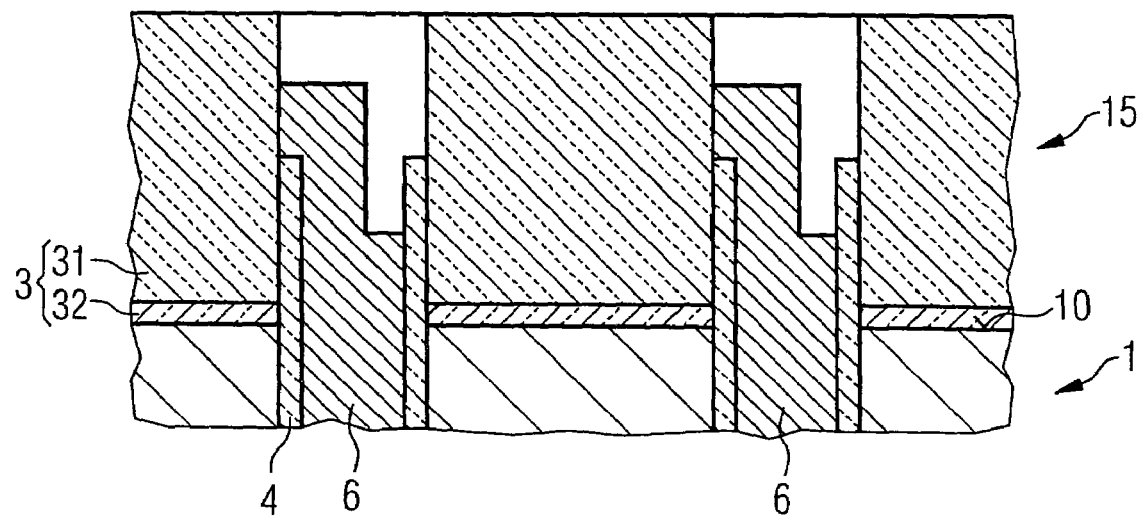

Referring to FIG. 9, that the inner electrode 6 is shaped back in sections from above the protective layer 3. An insulator material is introduced into the hole trench 2 and in the hole trench 2 forms a shallow trench isolation (STI) structure.

Figure 10:
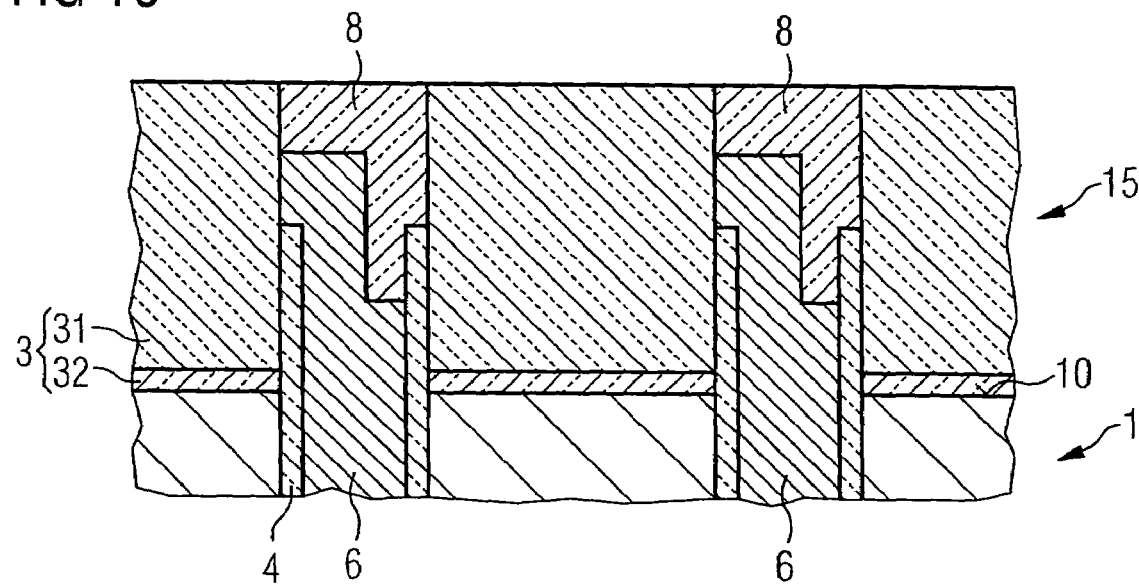

In FIG. 10, the shallow trench isolation structure 8 fills the hole trenches 2 above the inner electrode 6 up to the top edge of the protective layer 3. The silicon nitride layer 31 is removed, for example, by a wet-chemical process or means. The removal of the silicon nitride layer 31 uncovers a section of the filling of the hole trench 2 above the lower partial protective layer 32 as a cylinder projecting out of the lower partial protective layer 32.

Figure 11:
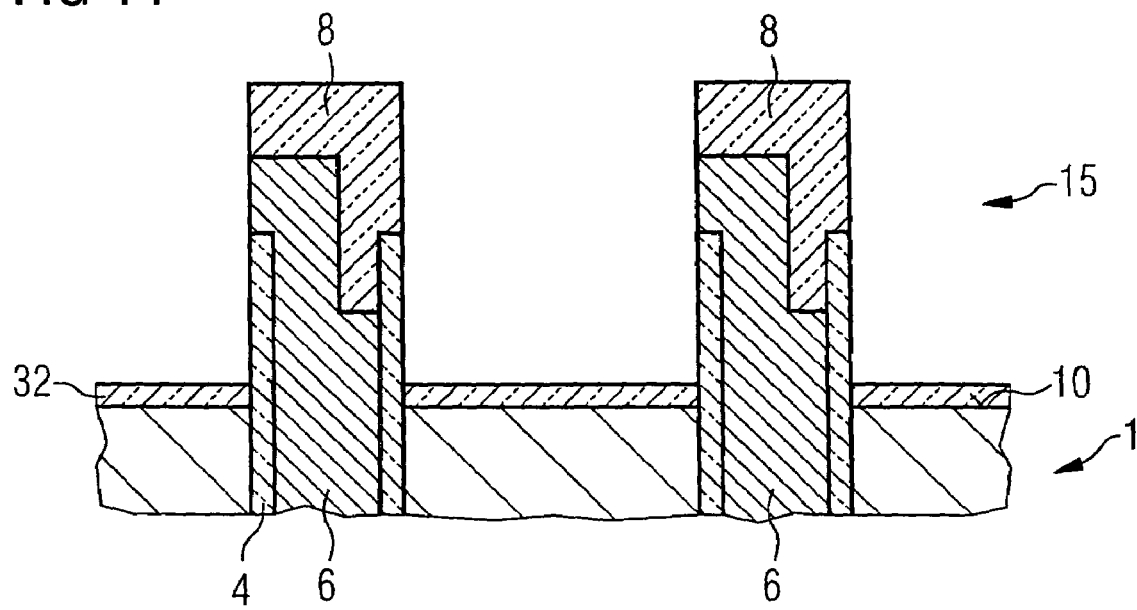

As illustrated in FIG. 11, the outer wall of the cylinder projecting out of the lower partial protective layer 32 is in a lower section formed by the insulation collar 4. In an upper section, the inner electrode 6 is uncovered on one side. The cylinder is closed off at the top end by the shallow trench isolation structure 8.

The uncovered surface of the inner electrode 6 is nitrided, and in this way, the transition surface 7, which is to be formed, is prepared on the side of the polysilicon of the inner electrode 6. The lower partial protective layer 32 is removed and the semiconductor substrate 1 beneath it is prepared for an epitaxy process.

Figure 12:
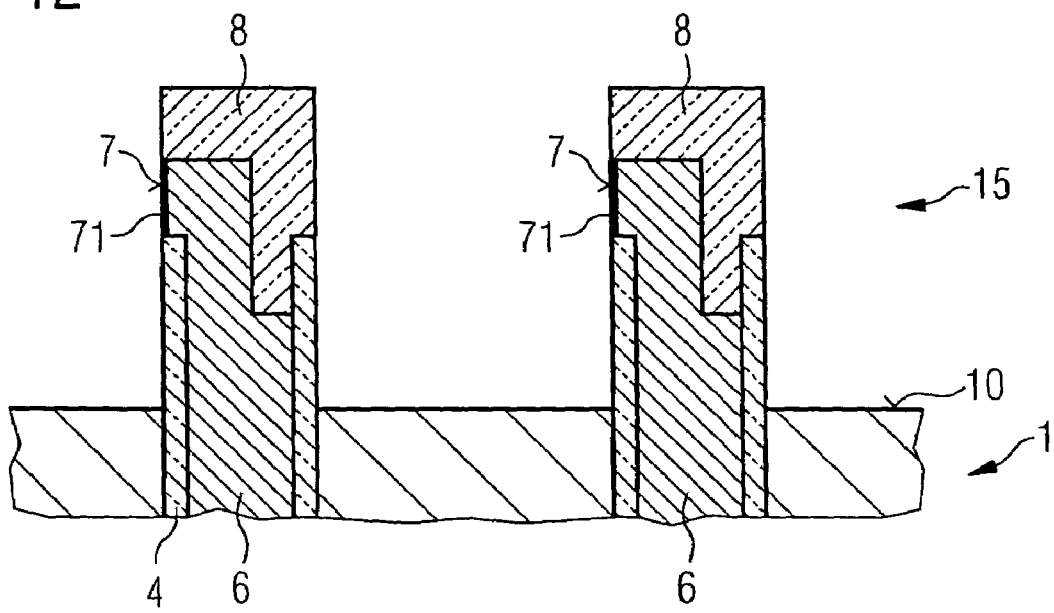

The nitrided surface at the inner electrode 6, which is uncovered between the insulation collar 4 and the shallow trench isolation structure 8, is illustrated in FIG. 12. The substrate surface 10 of the semiconductor substrate 1 has been uncovered around the cylinders.

Silicon is selectively grown homoepitaxially onto the semiconductor substrate 1, substantially as far as the top edge of the cylinders. The grown silicon forms an additional layer 13 of the semiconductor substrate 1. The additional layer 13 is provided, for example, in a layer thickness at which the shallow trench isolation structure 8 projects above the additional layer 13 by a desired step height. This makes it possible, for example, to set topology for a chemical mechanical polishing (CMP) process acting on the shallow trench isolation structure 8 in the memory cell array.

Figure 13:
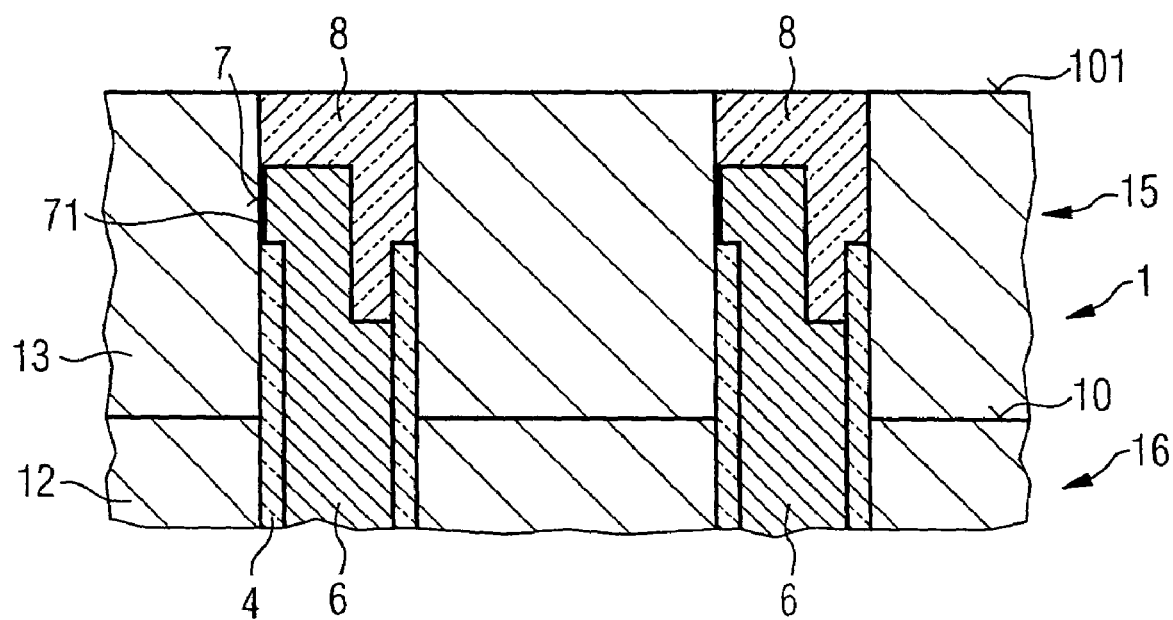

FIG. 13 shows the additional layer 13 of the semiconductor substrate 1, which has grown on the original substrate section 12 of the semiconductor substrate 1. A top edge of the additional layer 13 forms a new substrate surface 101. The transition surface 7 is formed completely in the region of the additional layer 13, above the original substrate surface 10. A connection section 15 of the semiconductor substrate 1 is formed completely above the original substrate surface 10, and an insulation section 16 of the semiconductor substrate 1 is formed at least partially above the original substrate surface 10. Continuing at least the transition surface 7 or the transition surface 7 and at least part of the insulation collar 4 to above the original substrate surface 10 means that a larger proportion of the hole trench 2 beneath the substrate surface 10 is available for the formation of electrode surfaces and therefore for increasing the capacitance of the storage capacitor.

Figure 14:
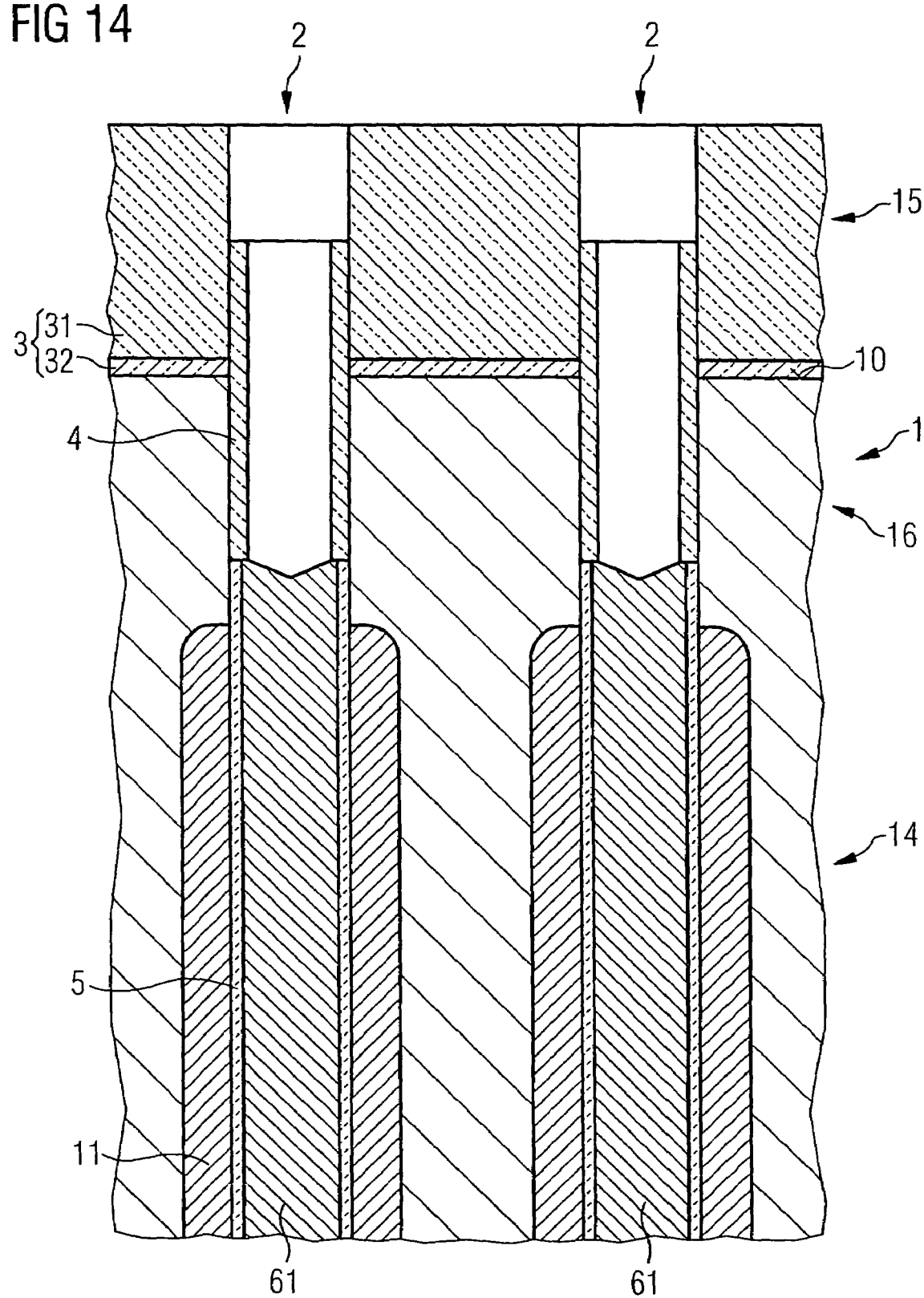
FIG. 14 to FIG. 15 show the fabrication of hole trench storage capacitors according to the invention in accordance with a second exemplary embodiment of the method according to the invention, in two process stages.

A second exemplary embodiment differs from the first exemplary embodiment of the method according to the invention in terms of the way in which the insulation collar is formed. Referring to FIG. 6, the insulation collar 4 is shaped back from a top edge by an ion beam etching process. FIG. 14 shows the result of this method step. Unlike the hole trench shown in FIG. 7, there is no second filling section 62.

Figure 15:
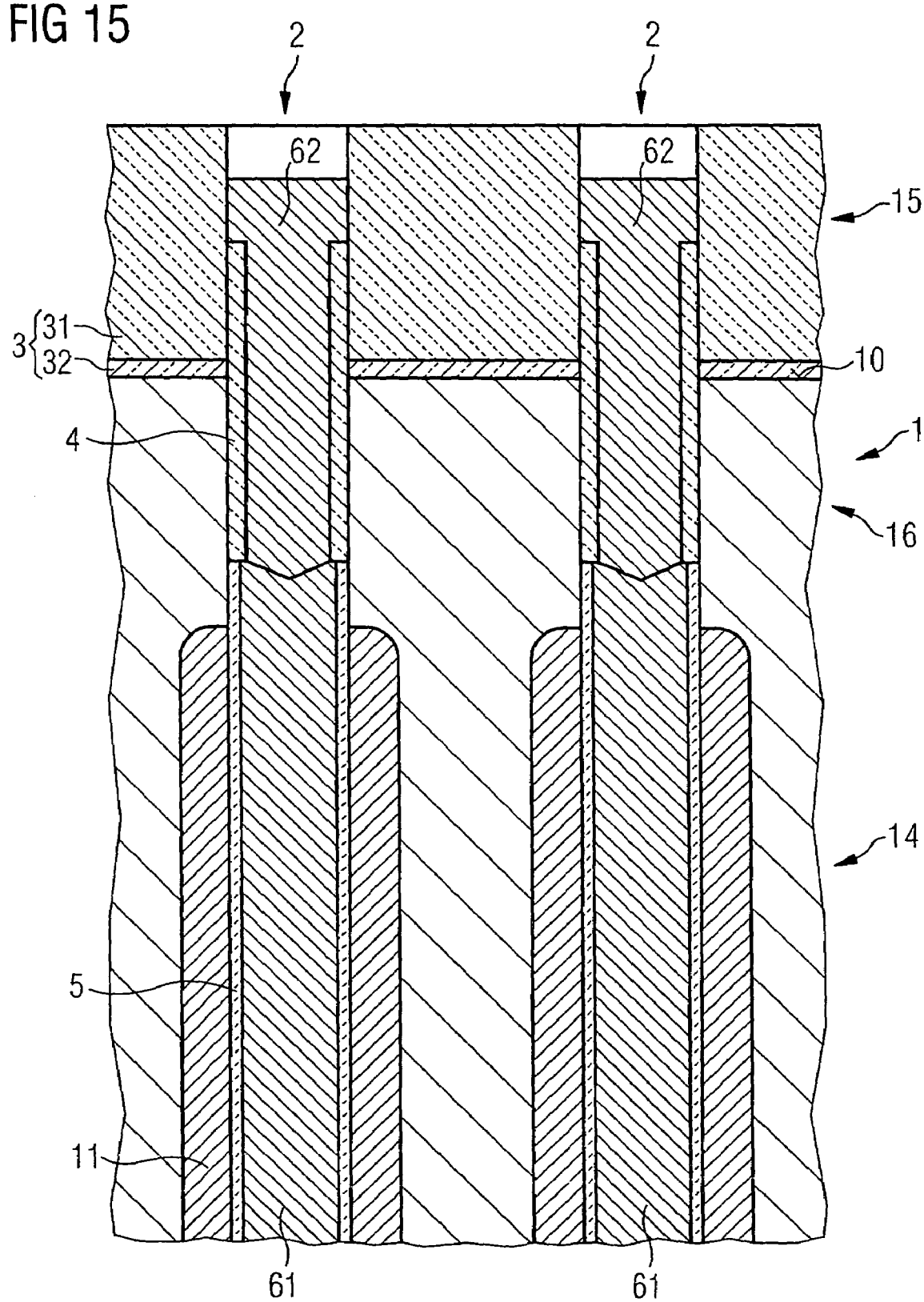

The top edge or vertical extent of the transition surface 7 is already defined by the second polysilicon filling and its subsequent etchback. The result of the etchback is illustrated in FIG. 15. Compared to FIG. 8, in FIG. 15, a cycle including deposition and etchback of a polysilicon filling is not needed.

The shaping or definition of the transition surface 7 is then no longer dependent on the variability of an etchback process for the third polysilicon filling. Closely linked to this is a lower aspect ratio for an etching step during the single-sided shaping back of the inner electrode during the SSBS formation.

Figure 16:
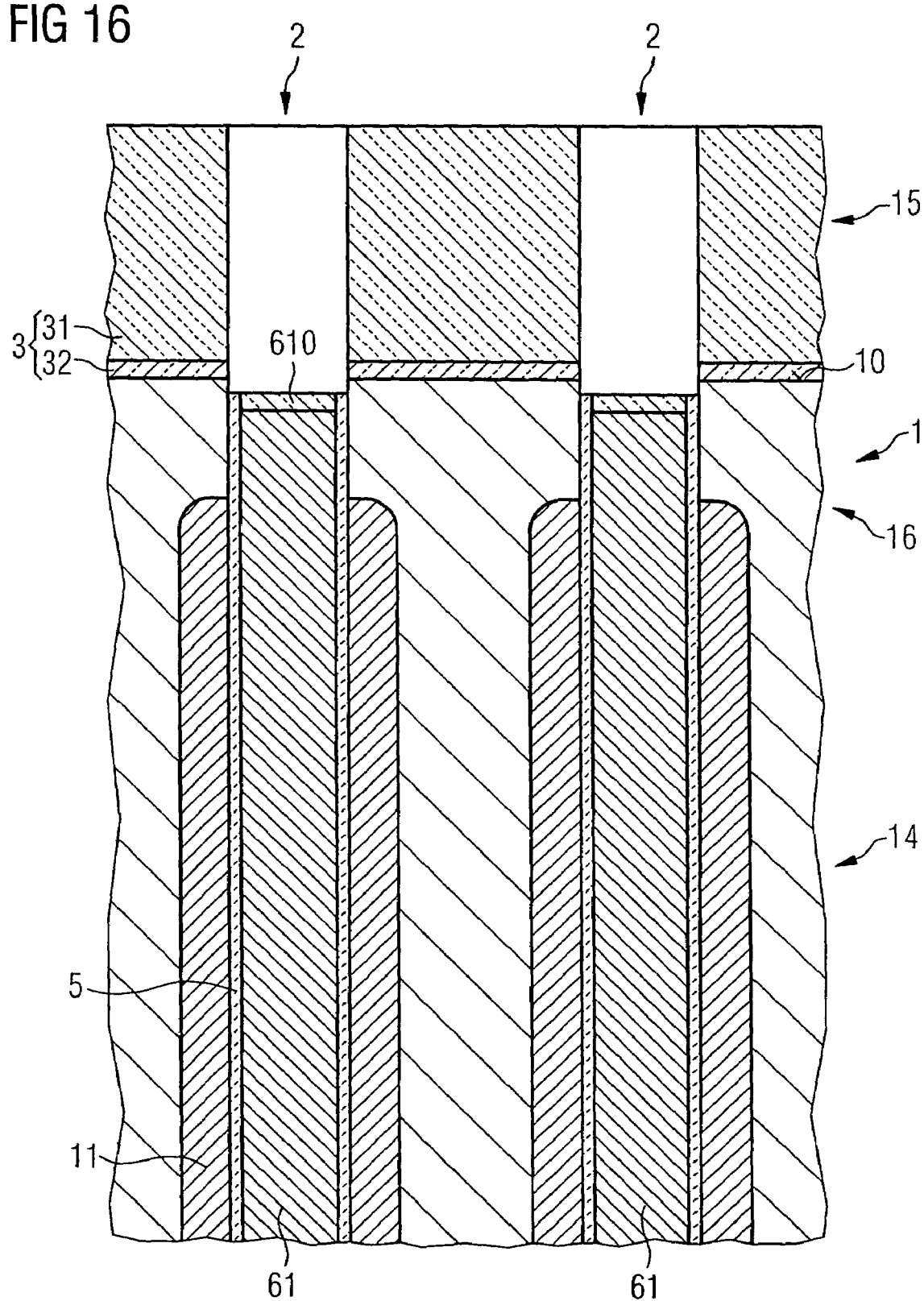
FIG. 16 to FIG. 18 show the fabrication of hole trench storage capacitors according to the invention in accordance with a third exemplary embodiment of the method according to the invention, in three process stages.
Figure 17:
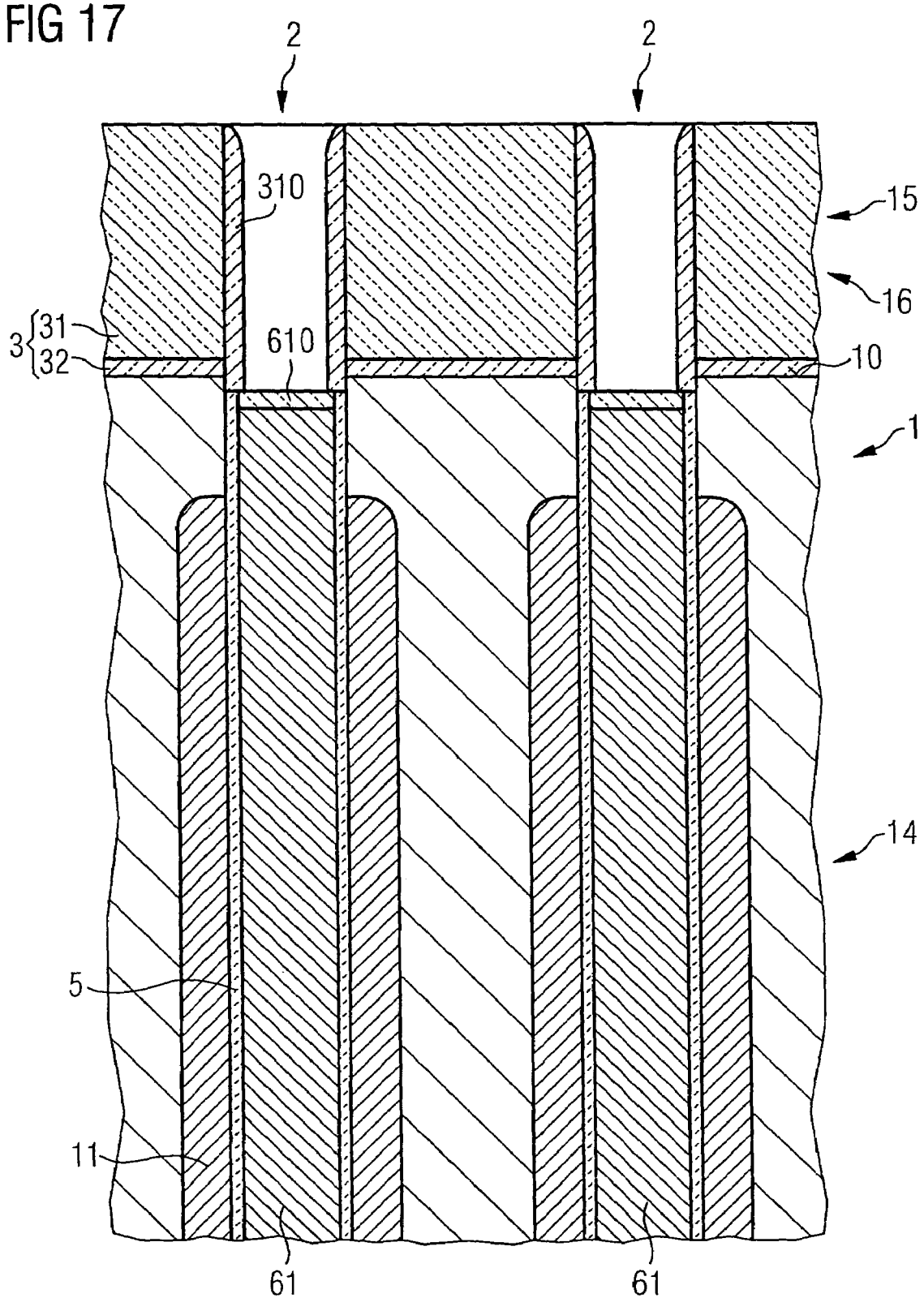
Figure 18:
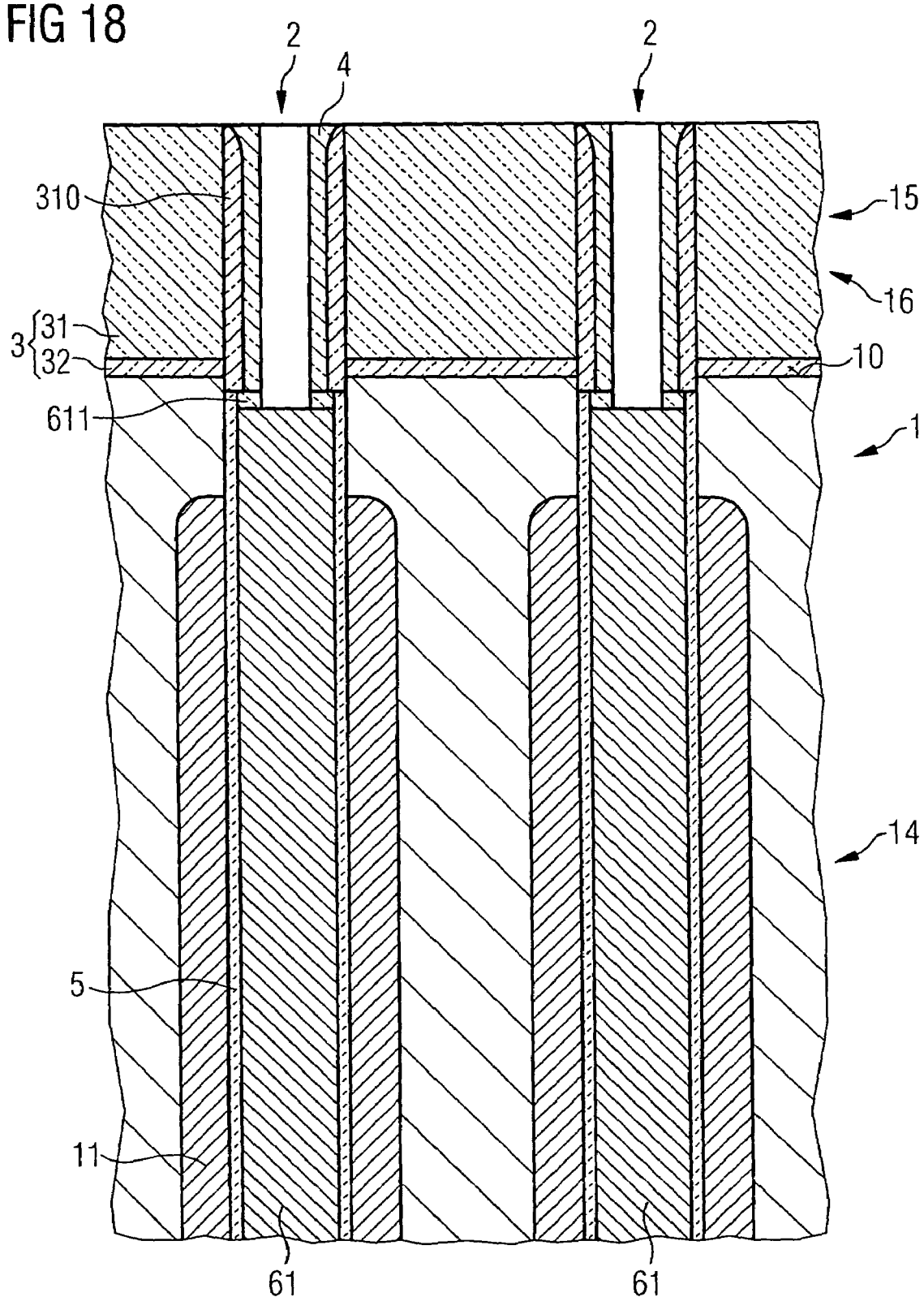

In the exemplary embodiment of the method according to the invention which is illustrated in FIGS. 16 to 18, the opening of the hole trench 2 is initially predetermined to be greater than the size defined by the minimum feature size. The introduction of the hole trench 2 and processing of a lower section of the hole trench 2 in which the electrode surfaces of the storage capacitor are formed are carried out using the larger opening. Then, in the region close to the surface, the opening is reduced in size in order to be matched to the maximum structure density, for example, in a checkerboard layout.

Therefore, a hole trench 2 is introduced into a semiconductor substrate 1 through a protective layer 3 with a cross section, which is approximately comparable to the cross section of a conventional hole trench in the widened cross-sectional region of a wet bottle etch profile. Since, according to the invention, the hole trench 2 has the larger or "relaxed" cross section compared to a hole trench with a wet bottle etch profile even at the substrate surface 10, the hole trench 2 can be provided with a greater depth, while using the same technically feasible aspect ratio, than a hole trench for wet bottle etching having the same cross section widened in the wet bottle etch profile. As has already been described, an outer electrode 11, a capacitor dielectric 5 and a first polysilicon filling are provided in the hole trench 2 or in the semiconductor substrate 1 surrounding the hole trench 2. The first polysilicon filling and the capacitor dielectric 5 are etched back to just below the substrate surface 10. A first filling section 61 is formed from the first polysilicon filling. The uncovered polysilicon is oxidized.

FIG. 16 shows the auxiliary insulator structure 610, which has been formed by surface oxidization of the first filling section 61 and closes off the first filling section 61. In the hole trench 2, a protective layer spacer 310 is formed above the auxiliary insulator structure 610 at least in the region of the silicon nitride layer 31. The protective layer spacer 310 is illustrated in FIG. 17. The protective layer spacer 310 relatively reduces the size of an opening for a cross section of the hole trench 2 at least in the region of the silicon nitride layer 31.

An insulation collar 4 is provided in the remaining opening of the cross section of the hole trench 2, and the auxiliary insulator layer 610 is opened up as far as the first filling section 61 during an ion beam etching process. FIG. 18 shows an auxiliary insulator structure 611, which has been formed as a result of the auxiliary insulator layer 610 being opened up and which isolates the first filling section 61 from the protective layer spacer 310, at the location of which an additional layer of the semiconductor substrate 1 grows, during further processing.

Figure 19:
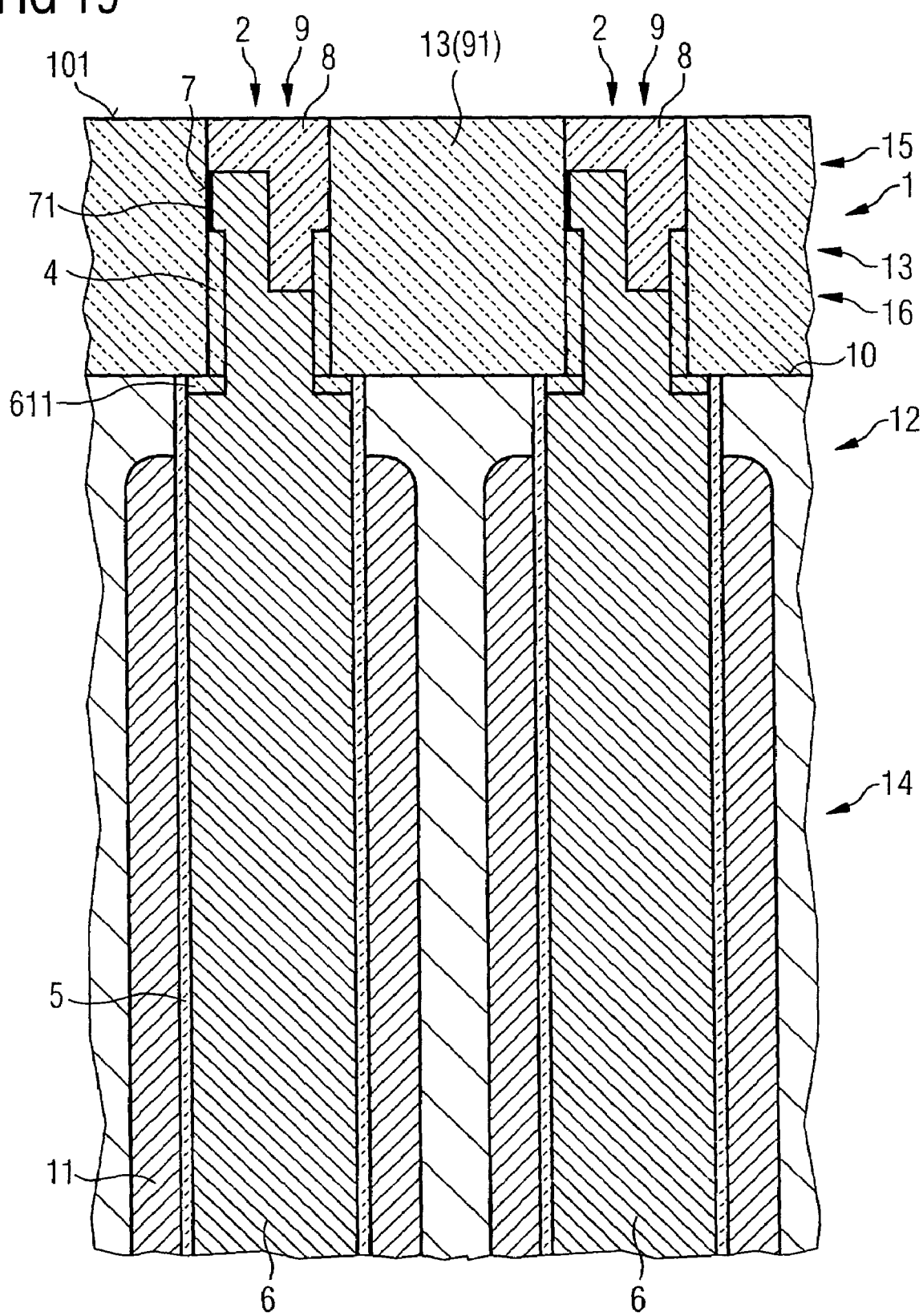
FIG. 19 shows two hole trench storage capacitors according to the invention in accordance with a fourth exemplary embodiment.

FIG. 19 shows a diagrammatic, simplified illustration of a further exemplary embodiment of two hole trench storage capacitors according to the invention. The hole trench storage capacitor 9 is formed in a semiconductor substrate 1, which is composed of an original substrate section 12 formed from monocrystalline silicon, and an additional layer 13 formed from silicon which is grown homoepitaxially on an original substrate surface 10 of the original substrate section 12. The original substrate section 12 has an electrode section 14 of the semiconductor substrate 1. The electrode section 14 includes a region of the storage capacitor 9, for storage of charge. An inner electrode 6 is formed in the interior of the hole trench 2. An outer electrode 11 of the storage capacitor 9 is formed as a doped region in the original substrate section 12 of the semiconductor substrate 1. A capacitor dielectric 5 is provided between the inner electrode 6 and the original substrate section 12 of the semiconductor substrate 1. In the region of the additional layer 13, the hole trench 2 has a reduced cross-sectional area. The reduced cross-sectional area corresponds to a lithography-related minimum feature size.

The inner electrode 6 is surrounded by an insulation collar 4. In an insulation section 16 of the semiconductor substrate 1 formed predominantly in the additional layer 13. The insulation collar insulates the inner electrode 6 from conductive regions or diffusion zones subsequently formed in the insulation section 14 of the semiconductor substrate 1. A top edge of the insulation collar 4 determines a bottom edge of a transition surface 7. The inner electrode 6, on one side, directly adjoins the semiconductor substrate 1 surrounding the inner electrode 6 in the connection section 15 of the semiconductor substrate 1 by the bottom edge of the transition surface 7. A shallow trench isolation structure 8 is provided in the hole trench 2 above the inner electrode 6. The shallow trench isolation structure 8 isolates the inner electrode 6 from further conductive regions or diffusion zones. An auxiliary insulator structure 611 adjoins the capacitor dielectric 5 and the insulation collar 4 and ensures the functionality of the insulation collar 4 in a shoulder region between the original and reduced cross sections of the hole trench. The transition surface 7 has a nitriding 71. At least one connection structure 91 is provided in the additional layer 13 as doped region. In functional terms, this connection structure 91 is, for example, a conductive connection region or a source/drain region of a select transistor which is assigned to the storage capacitor. The additional layer 13 forms a new substrate surface 101.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 Semiconductor substrate
10 Substrate surface
101 Substrate surface
11 Outer electrode
12 Original substrate section
13 Additional layer
14 Electrode section
15 Insulation section
16 Connection section
2 Hole trench
31 Upper partial protective layer (pad nitride)
310 Protective layer spacer (nitride spacer)
32 Lower partial protective layer (pad oxide)
4 Insulation collar
5 Capacitor dielectric
6 Inner electrode
61 First filling section of 6 (1st poly fill)
610 Auxiliary insulator layer
611 Auxiliary insulator structure
62 Second filling section of 6 (2nd poly fill)
63 Third filling section of 6 (3rd poly fill)
7 Transition surface (buried strap)
71 Nitriding
8 Shallow trench isolation structure (STI)
9 Storage capacitor
91 Connection structure

What is claimed:

1. A method for fabricating a storage capacitor for a memory cell of a semiconductor memory device in a semiconductor substrate, comprising:
    applying a protective layer to a substrate surface of the semiconductor substrate;
    introducing a hole trench into the semiconductor substrate through the protective layer;
    forming an outer electrode in an electrode section of the semiconductor substrate the outer electrode surrounding a lower section of the hole trench;
    lining the hole trench with a capacitor dielectric at least in the lower section;
    providing an inner electrode in the interior of the hole trench; and
    forming a transition surface between the inner electrode and a conductive connection structure formed in a connection section of the semiconductor substrate, the transition surface conductive connection structure surrounding an upper section of the hole trench, wherein forming the transition surface includes
        providing the inner electrode such that the inner electrode extends to beyond the substrate surface and in sections adjoins the protective layer,
        removing the protective layer, and
        growing an additional layer on the substrate surface by a selective epitaxy process, the additional layer thickening and the semiconductor substrate and providing the conductive connection structure in the additional layer such that the transition surface is formed above the original substrate surface.

2. The method as claimed in claim 1, further comprising: is forming an insulating collar in a middle section between the insulation section, the middle section being delimited by the lower section and by the upper section of the hole trench, of the semiconductor substrate and the inner electrode, the insulation collar surrounding the hole trench in the middle section, the insulation collar being provided at least in part in the region of the additional layer.

3. The method as claimed in claim 2, wherein the insulation collar is formed after forming the outer electrode, forming the insulation collar includes:
    lining the hole trench with the capacitor dielectric,
    introducing a conductive material into the hole trench,
    shaping back the capacitor dielectric and the conductive material to below the substrate surface, and in the process, determining a lower edge of the insulation section, and forming a first filling section of the inner electrode by the conductive material,
    lining the hole trench with an insulator material below the lower edge of the insulation section, and
    shaping back the insulator material as far as a top edge above the substrate surface such that the insulation collar is formed by the insulator material.

4. The method as claimed in claim 3, wherein the insulator material, which forms the insulation collar, is shaped back by an ion beam etching process.

5. The method as claimed in claim 3, wherein the insulator material, which forms the insulation collar, is shaped back by introducing a second conductive material into the hole trench,
- shaping back the second conductive material, and forming a second filling section of the inner electrode by the second conductive material, and
- shaping back the insulator material at least as far as a top edge of the second filling section.

6. The method as claimed in claim 4, wherein forming the transition surface includes
- providing the inner electrode adjacent to the protective layer as a result of a third conductive material being introduced into the hole trench following the formation of the insulation collar,
- surrounding the third conductive material by the protective layer between an opening of the hole trench and the top edge of the insulation collar, and
- forming a further filling section of the inner electrode by the third conductive material.

7. The method as claimed in claim 6, wherein the inner electrode is shaped back in the hole trench, thereby defining a vertical extent of the transition surface.

8. The method as claimed in claim 6, wherein the inner electrode in the hole trench is shaped back on one side to at least beneath the top edge of the insulation collar.

9. The method as claimed in claim 7, further comprising:
- introducing a further insulator material into the trench, the further insulator material forming a shallow trench isolation structure in the hole trench above the inner electrode.

10. The method as claimed in claim 1, wherein the inner electrode is nitrided in the transition region.

11. The method as claimed in claim 1, wherein applying the protective layer includes:
- providing a lower partial protective layer on the substrate surface, the lower partial protective layer including, silicon oxide, and
- providing an upper partial protective layer on the lower partial protective layer the upper partial protective layer including silicon nitride.

12. The method as claimed in claim 11 wherein, removing the protective layer includes
- removing the upper partial protective layer including silicon nitride, and
- removing the lower partial protective layer including silicon oxide.

13. The method as claimed in claim 12, wherein, an uncovered section of the inner electrode in the region of the transition surface is nitrided, following the removal of the upper partial protective layer and prior to the removal of the lower partial protective layer.

14. The method as claimed in claim 1, wherein prior to filling of the hole trench above the substrate surface in the region of the protective layer, the hole trench is lined with a protective layer spacer, which reduces the size of an opening of the hole trench.

15. The method as claimed in claim 14, wherein the remaining opening of the hole trench is defined to correspond to a lithography-related minimum feature size.

16. The method as claimed in claim 14, wherein providing the protective layer spacer includes;
- providing the first filling section of the inner electrode substantially up to just below the substrate surface,
- oxidizing the first filling section at the uncovered surface,
- forming an auxiliary insulator layer by the oxidized region of the first filling section, and
- during or after forming of the insulation collar, opening the auxiliary insulator layer and forming an annular auxiliary insulator structure from the auxiliary insulator layer.

17. The method as claimed in claim 9, wherein before removing the protective layer, a layer thickness of the protective layer is recorded,
- the epitaxy process is controlled based on of the result of the layer thickness measurement, and
- a remaining step height of the shallow trench isolation structure is set so as to compensate for a topology over the semiconductor substrate.

* * * * *

UNITED STATES PATENT AND TRADEMARK OFFICE
CERTIFICATE OF CORRECTION

PATENT NO. : 7,084,029 B2 Page 1 of 1
APPLICATION NO. : 10/948574
DATED : August 1, 2006
INVENTOR(S) : Srivatsa Kundalgurki et al.

It is certified that error appears in the above-identified patent and that said Letters Patent is hereby corrected as shown below:

Col. 12, l. 28: Delete "transition surface".

Col. 12, l. 37: Replace "semiconductor substrate and" with --semiconductor substrate--.

Col. 12, l. 42: Delete "is".

Col. 14, l. 21: Replace "includes;" with --includes:--.

Signed and Sealed this

Thirtieth Day of January, 2007

JON W. DUDAS
*Director of the United States Patent and Trademark Office*